(12) United States Patent  
Van Dis

(10) Patent No.: US 11,492,290 B2  
(45) Date of Patent: Nov. 8, 2022

(54) COATING APPARATUS FOR CONTAINERS

(71) Applicant: Arkema France, Colombes (FR)

(72) Inventor: Bram Van Dis, Kruisland (NL)

(73) Assignee: ARKEMA FRANCE, Colombes (FR)

(*) Notice: Subject to any disclaimer, the term of this patent is extended or adjusted under 35 U.S.C. 154(b) by 314 days.

(21) Appl. No.: 16/496,528

(22) PCT Filed: Mar. 30, 2018

(86) PCT No.: PCT/EP2018/058334  
§ 371 (c)(1),  
(2) Date: Sep. 23, 2019

(87) PCT Pub. No.: WO2018/178355  
PCT Pub. Date: Oct. 4, 2018

(65) Prior Publication Data  
US 2020/0377407 A1 Dec. 3, 2020

(30) Foreign Application Priority Data  
Mar. 31, 2017 (EP) ..................... 17164315

(51) Int. Cl.  
*C03C 17/00* (2006.01)  
*B05B 13/02* (2006.01)  
(Continued)

(52) U.S. Cl.  
CPC ........ *C03C 17/005* (2013.01); *B05B 13/0221* (2013.01); *B05B 14/00* (2018.02);  
(Continued)

(58) Field of Classification Search  
USPC ..... 118/326, 324, 62, 63, 64, 314, 602, 603; 65/60.1, 60.2; 427/424  
See application file for complete search history.

(56) References Cited

U.S. PATENT DOCUMENTS 3,688,737 A * 9/1972 Augustsson ............ C23C 16/04  
118/720  
4,389,234 A 6/1983 Lindner  
(Continued)

FOREIGN PATENT DOCUMENTS

EP 0378116 A1 7/1990  
EP 2799405 A1 11/2014  
(Continued)

OTHER PUBLICATIONS

ISA/EP; International Search Report and Written Opinion for International Patent Application No. PCT/EP2018/058334 dated May 11, 2018, 8 pages.

*Primary Examiner* — Yewebdar T Tadesse  
(74) *Attorney, Agent, or Firm* — NK Patent Law

(57) ABSTRACT

The present invention relates to a coating apparatus also called coating tunnel or coating hood for applying a protective coating to hollow glass containers. In particular it relates to a coating apparatus also called coating tunnel or coating hood with air curtains for reducing the loss of the carrier gas comprising a coating compound for applying the protective coatings to glass containers. More particularly the present invention relates to a coating apparatus also called coating tunnel or coating hood with specific air curtains at the entry and the exit of the coating apparatus for reducing the loss of the carrier gas comprising a coating compound for applying the protective coatings to glass containers.

18 Claims, 8 Drawing Sheets

Figure 1A:
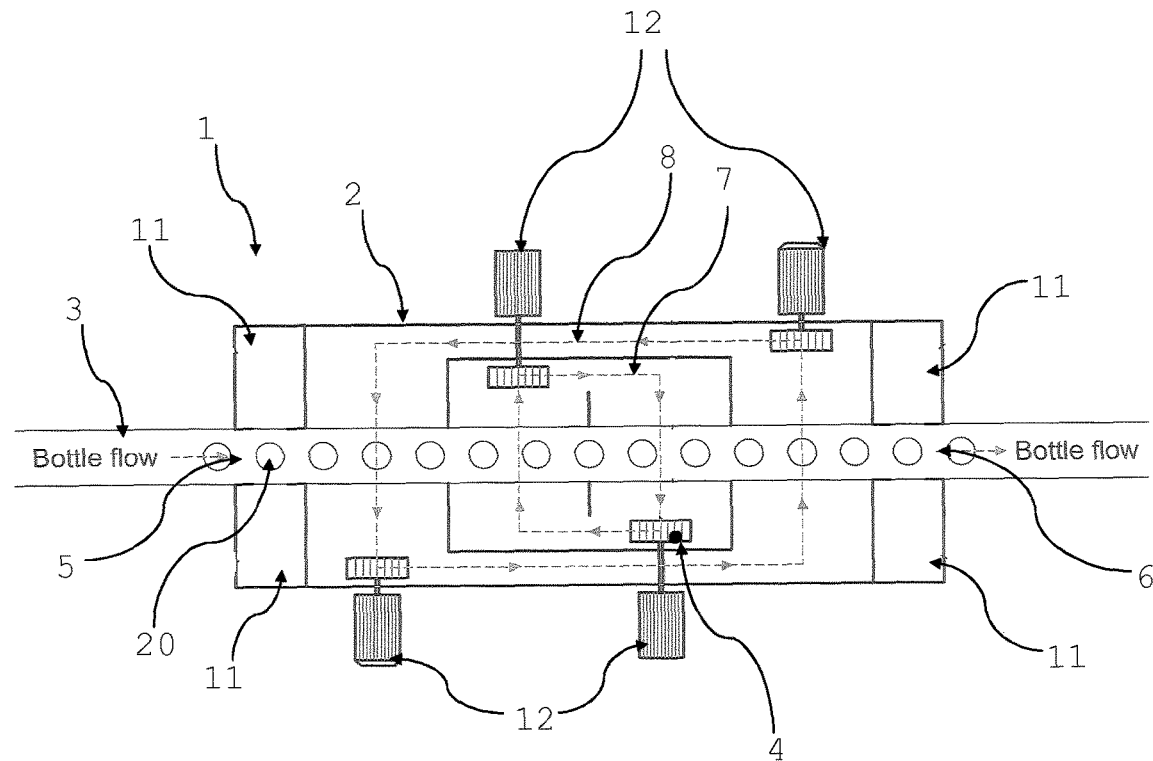

(51) Int. Cl.
  *B05B 14/00* (2018.01)
  *B05B 15/00* (2018.01)
  *C23C 16/52* (2006.01)
  *C23C 16/54* (2006.01)
  *B05B 16/60* (2018.01)
  *B05B 16/00* (2018.01)
  *B05B 14/40* (2018.01)

(52) U.S. Cl.
  CPC .............. *B05B 14/40* (2018.02); *B05B 15/00* (2013.01); *B05B 16/60* (2018.02); *B05B 16/90* (2018.02); *C23C 16/52* (2013.01); *C23C 16/54* (2013.01); *C03C 2217/78* (2013.01); *C03C 2218/1525* (2013.01)

(56) References Cited

U.S. PATENT DOCUMENTS

| | | | |
|---|---|---|---|
| 4,529,627 A * | 7/1985 | Zurbig | C03C 17/2456 427/255.19 |
| 4,668,268 A | 5/1987 | Lindner et al. | |
| 4,928,627 A * | 5/1990 | Lindner | C23C 16/54 118/718 |
| 5,140,940 A | 8/1992 | Lindner | |
| 2016/0101898 A1* | 4/2016 | Meurer | C23C 16/45595 428/34.6 |

FOREIGN PATENT DOCUMENTS

| | | | |
|---|---|---|---|
| WO | 9633955 A1 | 10/1996 | |
| WO | 2014177651 A1 | 11/2014 | |
| WO | 2016207307 A1 | 12/2016 | |

* cited by examiner

COATING APPARATUS FOR CONTAINERS

CROSS REFERENCE TO RELATED APPLICATIONS

This application is a U.S. National Stage application of International Patent Application No. PCT/EP2018/058334, filed on Mar. 30, 2018, which claims the benefit of European Patent Application No. 17164315.8, filed on 31 Mar. 2017.

FIELD OF THE INVENTION

The present invention relates to a coating apparatus also called coating tunnel or coating hood for applying a protective coating to hollow glass containers.

In particular it relates to a coating apparatus also called coating tunnel or coating hood with air curtains for reducing the loss of the carrier gas comprising a coating compound for applying the protective coatings to glass containers.

More particularly the present invention relates to a coating apparatus also called coating tunnel or coating hood with specific air curtains at the entry and the exit of the coating apparatus for reducing the loss of the carrier gas comprising a coating compound for applying the protective coatings to glass containers.

TECHNICAL PROBLEM

Hollow glass containers are produced from molten glass at molds at high temperatures. As the surface of these containers is fragile and in order to preserve the strength of the glass and to prevent any direct glass to glass contact of the respective containers in order to avoid damage, they are surface coated with a wax coating which will not attach to clean glass. Therefore a coating directly after forming of the container is needed.

Such a coating that includes tin or tin tetrachloride, titanium or other heat decomposable metallic or organometallic compounds protects the glass container surface in from damage such as abrasions and scratches, which result in a loss of tensile strength for the glass container. The need for high tensile strength in a glass container is particularly acute when containers are mass produced, move rapidly in close proximity along high speed conveyor lines.

This coating application is done inside a coating apparatus also called a coating tunnel or coating hood with a so called hot end coating by chemical vapor deposition usually in forming a thin layer of a metal oxide, for example tin oxide. The objective is to coat the outside of the bottle with a homogenous even layer except for the so called finish.

The coating tunnel or coating hood receives the glass containers via a conveyer belt from the glass container making equipment with a relatively high speed, meaning between 0.3 up to 1.5 m/s which corresponds to approximately 90 to 700 glass containers per minute. The temperature of the containers excess 400° C. at the surface of the containers, so that when the heat decomposable inorganic metallic or organometallic compound (coating compound) is applied thereto, said compound reacts immediately and is converted to a metal oxide coating. The coating compound is fed in the coating tunnel and circulates inside with the aid of a carrier gas around the passing glass containers.

As the glass containers pass the coating hood at this high speed they risk to draw the coating compound out of the tunnel when leaving the hood through the outlet. The coating compound can attack building components and give health and safety issues. A venting system has to be installed for above mentioned reasons. For avoiding and minimizing this, the carrier gas comprising the coating compound is sucked into an exhaust system and is discarded. Consequently the coating compounds and chemicals are lost and the coating performance in view of introduced coating chemical is rather low.

On the other side when entering the tunnel through the inlet the glass containers draw in fresh air from the outside. In doing so they dilute the coating compound inside the tunnel. In order to apply a minimum necessary coating thickness on the glass containers more coatings compound has to be introduced in order to guarantee the required concentration of the coating chemical in the coating hood or tunnel for the chemical vapor deposition.

There is still the need for more efficient glass coating hoods, with low losses of the coating compound material to the atmosphere, reduce the exposure in the surroundings of the hood towards the coating chemicals, reduce the loss of coating compound and a homogeneous application of the coating on the glass container.

An objective of the present invention is to reduce the exposure in the surroundings of the hood towards the coating chemicals and to reduce the loss of coating compound.

Another objective of the present invention is to have a more homogenous distribution of the coating on the surface of the glass containers and reduce the variation of the thickness of the coating on the glass container surface.

Another objective of the present invention is to lower the discharge of the coating chemical and reducing the pressure inside the coating apparatus relative to the surroundings.

An objective of the present invention is to have a lower consumption of the coating chemical while applying the same thickness of coating to the glass container.

Still another objective of the present invention is to lower the emissions of chemicals in the coating area and near the coating tunnel or coating hood and reduce the exposure of chemicals in the surrounding working area.

Again another objective of the present invention is to decrease the cleaning intervals of the coating hood and make the cleaning of the equipment easier.

An additional objective of the present invention is to provide a coating hood with a better efficiency, coating more bottles at the same time.

Surprisingly it has been found that with the incorporation of at least two air curtains respectively at the inlet and the outlet of the coating apparatus, some or several of before mentioned problems can be solved.

BACKGROUND OF THE INVENTION

Prior Art

Coating apparatus for glass containers and the respective standard components are well known from the prior art.

The document U.S. Pat. No. 4,389,234 describes a glass coating hood possessing two or multiple loops. The coating is first fed into an innermost loop and then in an outermost loop. There is also a possibility of using a third loop, but all loops are recirculating loops in order to make better use of the coating material. Consequently the concentration of the coating compound decreases which each recirculating loop. At the end the non used coating compound enters an exhaust system.

The document U.S. Pat. No. 5,140,940 describes also a double loop coating hood, as described before. The coating apparatus based on its respective embodiments contains single or multiple air circulating loops.

The document EP0378116 describes a hot end coating apparatus. The hot end coating apparatus has two additional separate air circuits in the inlet and outlet region of a vapour-deposition hood. The air circuits produce two opposite flow zones flowing through the vapour-deposition hood in the transverse direction, the inner flow zone being enriched to the maximum degree with a coating agent and the outer flow zone forming a protective air curtain consisting of the used air from the coating zone, the degree of enrichment of the said air being correspondingly lower. However two additional feed points of the coating agent are needed one for each circuit.

The document WO2001/0255503 describes a glass container coating hood having additional loops; in one embodiment one loop of air or in another embodiment the hood uses counter current loops of air for carrying the coating. The coating hood comprises means for shaping the air flow.

The document WO96/33955 describes a method and apparatus for applying a layer to bottles. The method is made by a coating apparatus that comprises a gas curtain screening apparatus arranged before the inlet and/or after the outlet of the coating tunnel. The gas curtain is fed by pure gas, no coating causing chemical is added, nitrogen or ambient air are exemplified, in order to avoid clogging of the outflow openings.

The document WO2014/177651 discloses a coating hood having an air entry and a loop returning the air enriched with the coating compound and carrier gas from the outlet to the inlet of the coating hood.

The document WO2016/207307 discloses a coating hood having an air entry and a loop separation the first transferring the air enriched with the coating compound and carrier gas from the outlet to the inlet of the coating hood the second returning the air enriched with the coating compound and carrier gas close to the air entry of the coating hood.

None of the cited prior art discloses a coating apparatus having such air curtains installed respectively at the inlet and the outlet of the coating apparatus.

BRIEF DESCRIPTION OF THE INVENTION

Surprisingly it has been discovered that a coating apparatus for applying a coating on glass containers with a chemical compound comprising:
 a housing (2) with a coating tunnel,
 a conveyer belt (3) moving the containers (20) through the coating tunnel from the inlet (5) to the outlet (6) of the said coating tunnel,
 at least one circuit (7) for circulation of a coating compound and
 at least two air curtains (25a) and (25b) a first at the inlet (5) and a second the outlet (6);
solves some of the above mentioned problems.

It has also been found that a process of applying a coating on the surface of glass containers comprising the steps of:
 conveying the glass containers (20) on a conveyer belt (3) through a coating tunnel inside a housing (1) from the inlet (5) to the outlet (6),
 circulating a coating compound through the coating tunnel with a circuit (7),
 using at least two air curtains (25a) and (25b) a first at the inlet (5) and a second the outlet (6),
can solve some the above mentioned problems.

Surprisingly it has also been discovered that the use of at least two air curtains (25a) and (25b) a first at the inlet (5) and a second at the outlet (6) in a coating apparatus for applying a coating on glass containers with a chemical compound comprising:
 a housing (2) with a coating tunnel,
 a conveyer belt (3) moving the containers (20) through the coating tunnel from the inlet (5) to the outlet (6) of the said coating tunnel,
 at least one circuit (7) for circulation of a coating compound solves some the above mentioned problems.

Surprisingly it has also been discovered that the introduction of at least two air curtains (25a) and (25b) a first at the inlet (5) and a second at the outlet (6) to the coating apparatus for applying a coating on glass containers with a chemical compound, reduces the consumption of the coating chemical and/or lower the discharge of the coating chemical.

The invention is best understood from the following detailed description when read in connected with the accompanying drawings with the following figures:

FIG. 1a: schematic representation of existing hood from the state of the art.

Figure 1B:
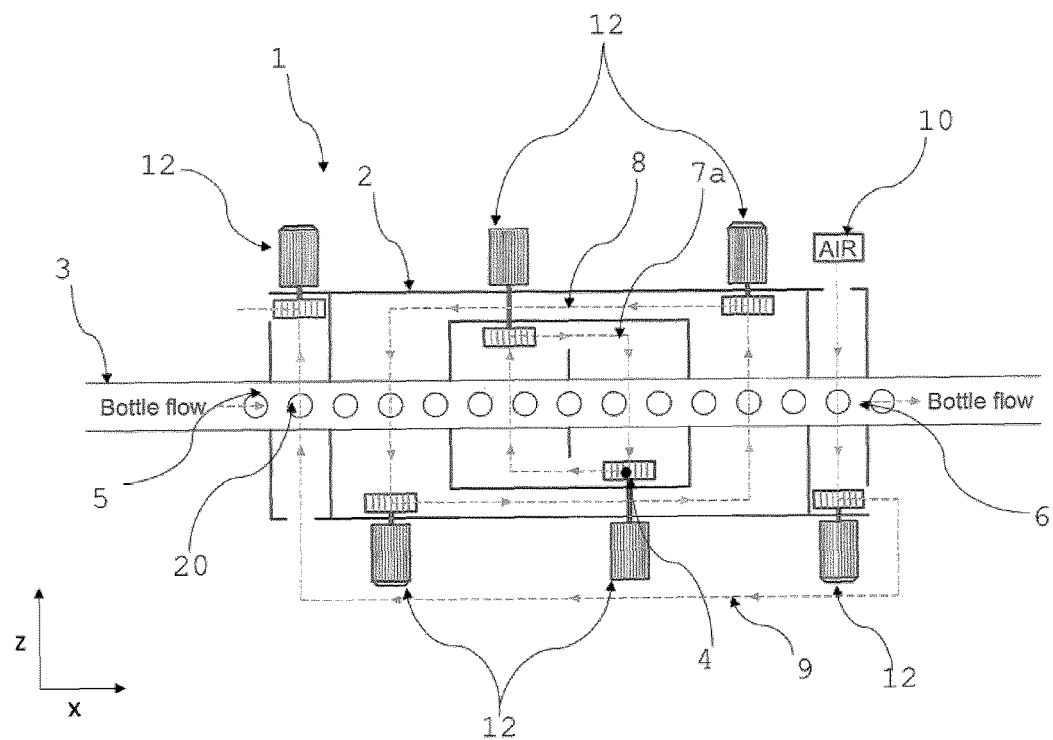

FIG. 1b: schematic representation of another existing hood from the state of the art with other loop configuration, namely a recirculation loop (8) and half open loop (9).

Figure 2:
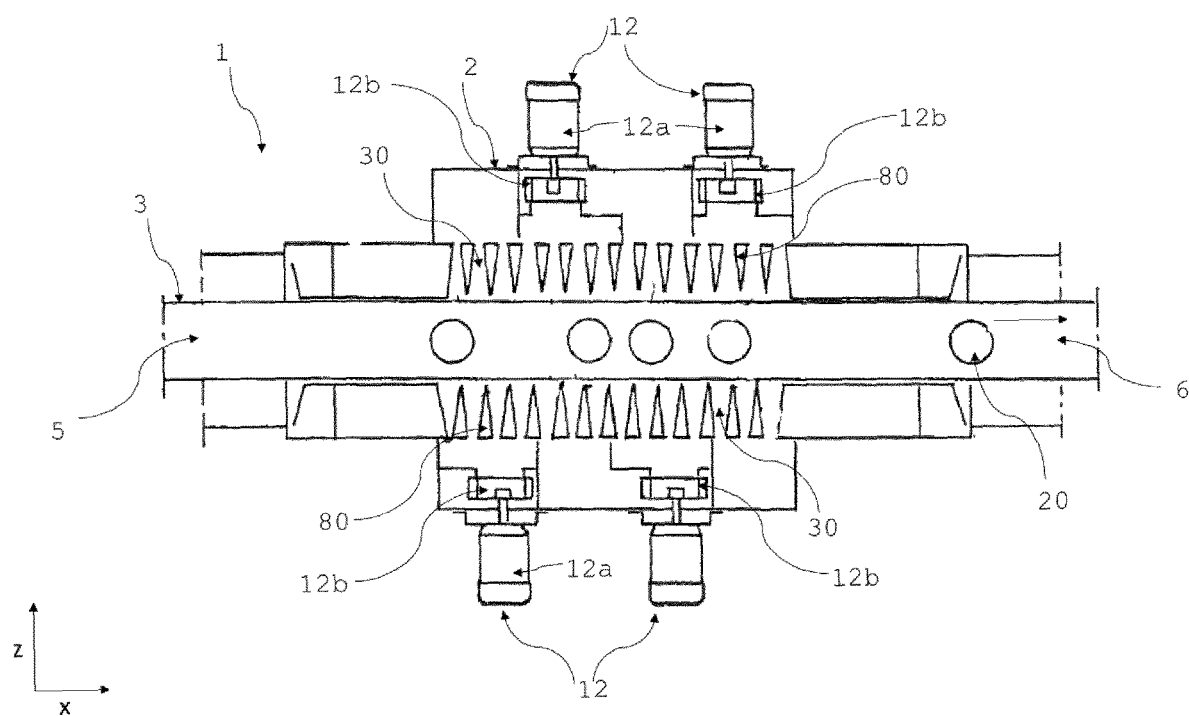

FIG. 2: schematic representation of existing hood from the state of the art with shown slots in the inner side wall.

Figure 3:
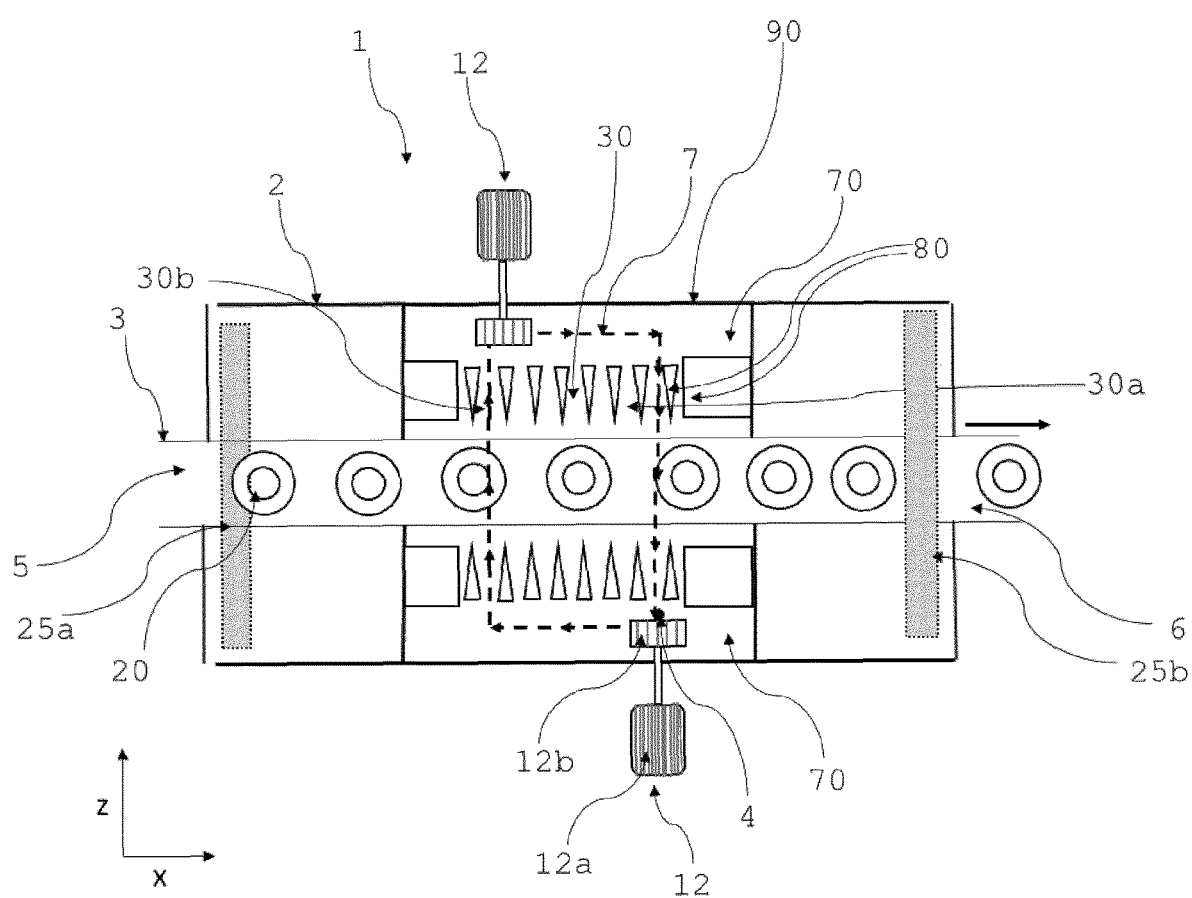

FIG. 3: schematic representation of the hood according to one embodiment of the present invention with two air curtains (25a) (25b) a first at the inlet (5) and a second at the outlet (6). The air curtain is represented by the grey rectangle and embodiments are more detailed in FIG. 4, FIG. 7 and FIG. 8.

Figure 4:
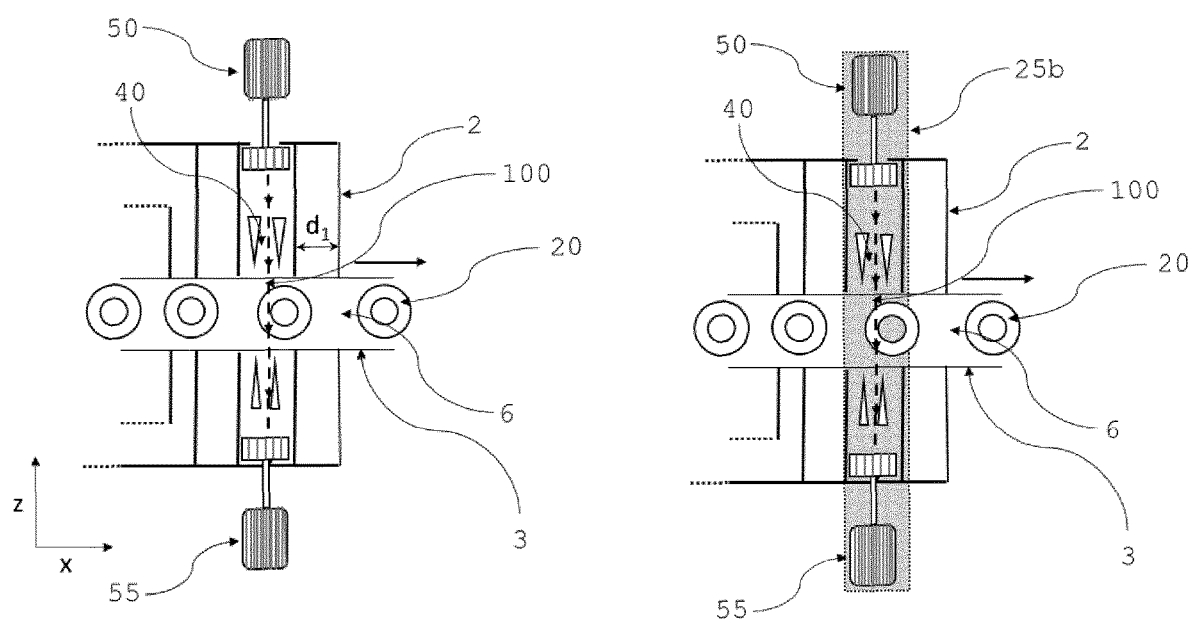

FIG. 4: schematic representation of one embodiment of the air curtain (25a) or (25b). As an example an air curtain (25b) at the outlet (6) is given. In the right part of FIG. 4 the grey rectangle is given to better show the mechanical parts of the air curtain (25b). The air curtain (25b) comprises the lateral air flow (100) perpendicular towards the conveyer belt (3), one blower (50), one jet slot (40) and an exhaust blower (55).

Figure 5:
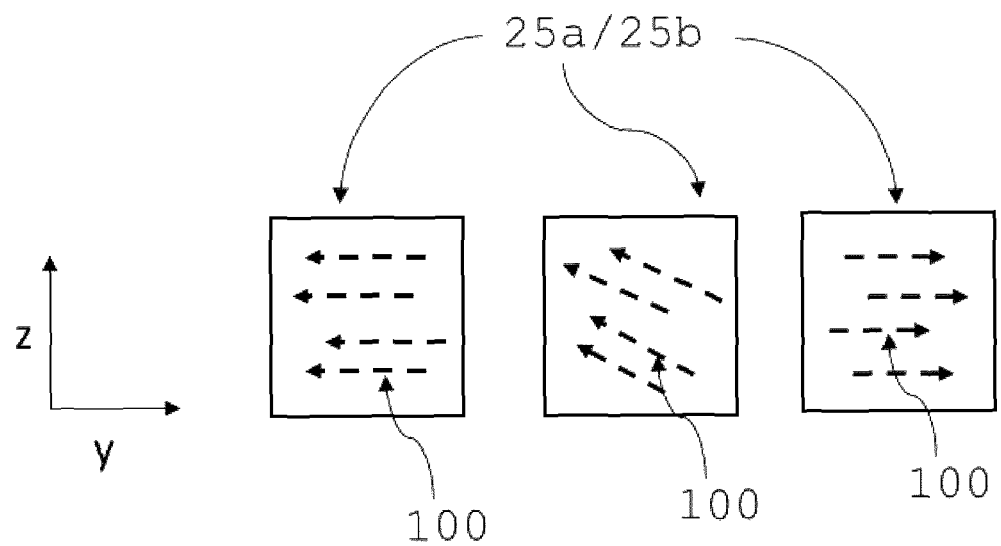
Figure 5:
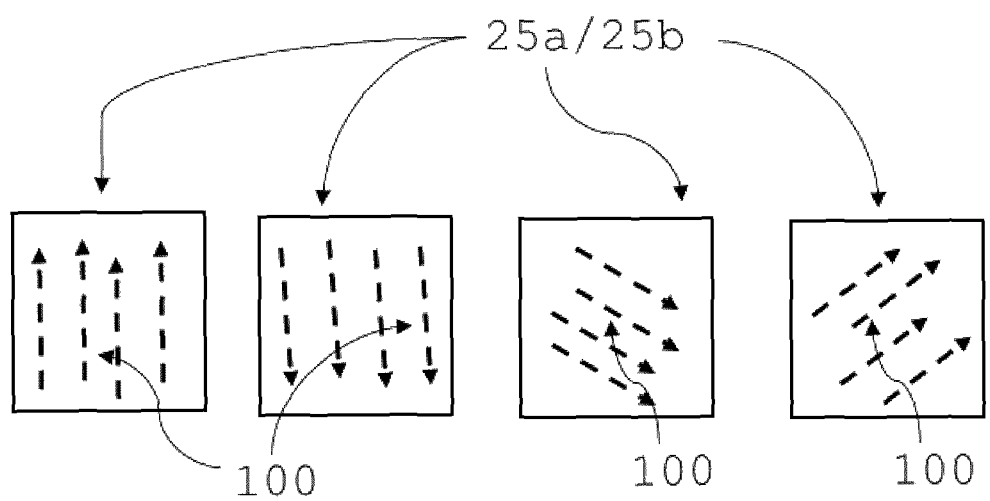

FIG. 5: front view in the y/z plane of the air curtains (25a) or (25b), where the air flow (100) direction is indicated by flashes.

Figure 6:
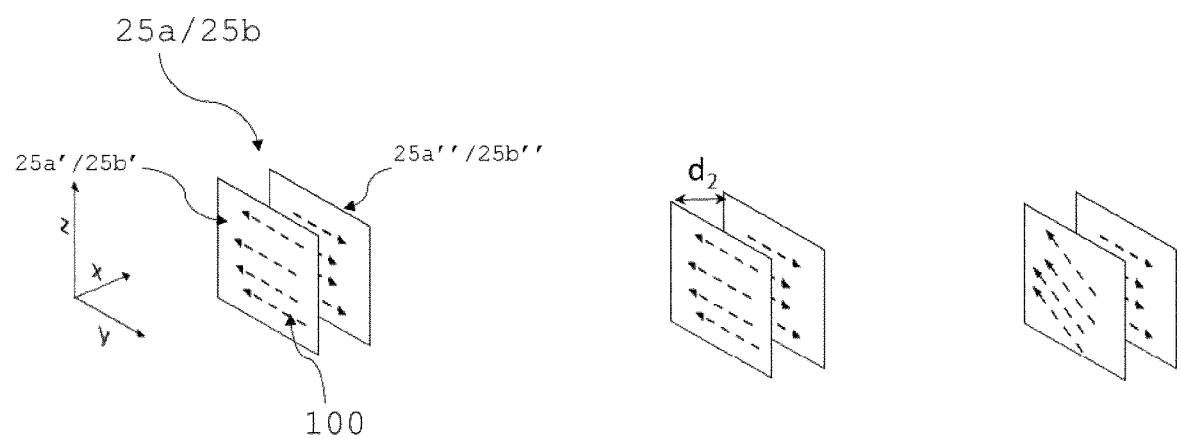

FIG. 6: combinations of two air curtains called sub air curtains (25a') or (25b') and (25a") or (25b") for air curtains (25a) or (25b) in dimensional view, with a distance $d_2$ between the two sub air curtains (25a') or (25b') and (25a") or (25b").

Figure 7:
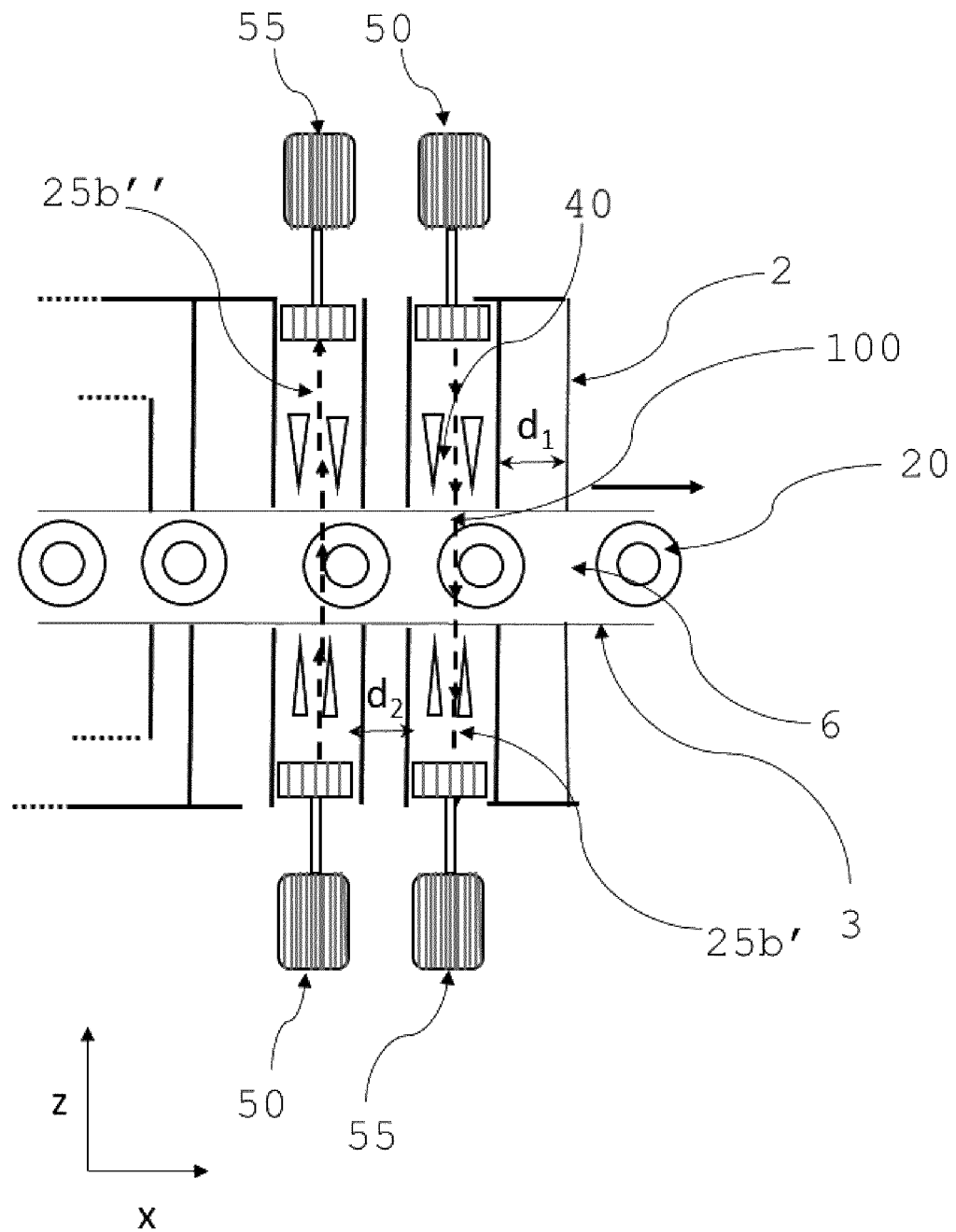

FIG. 7: schematic representation of one embodiment of the air curtain (25b) with two sub air curtains (25b') and (25b"). The air flow of the two sub air curtains (25b') and (25b") is in different directions.

Figure 8:
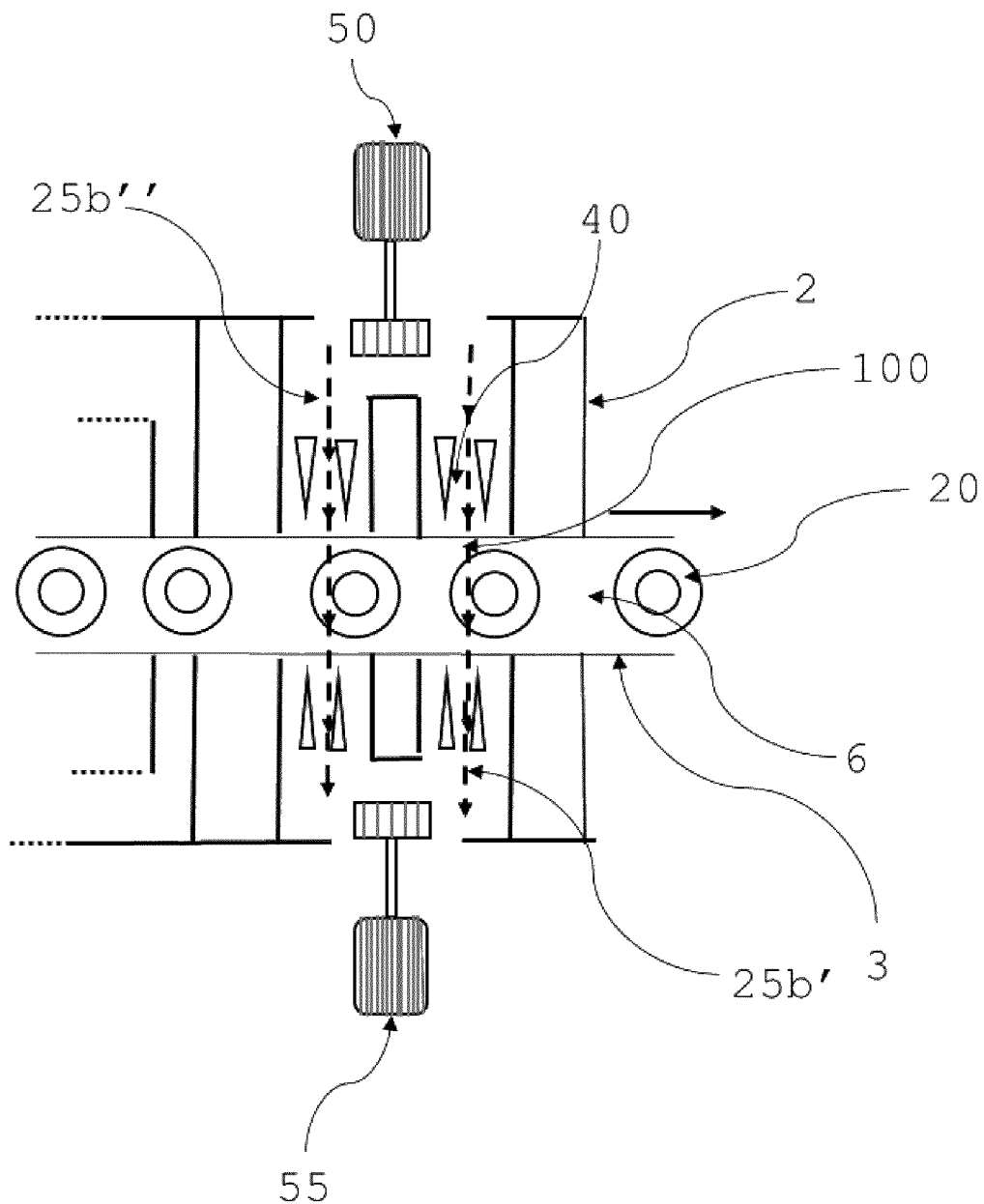

FIG. 8: schematic representation of one embodiment of the air curtain (25b) with two sub air curtains (25b') and (25b"). The air flow of the two sub air curtains (25b') and (25b") is in the same direction.

DETAILED DESCRIPTION OF THE INVENTION

In a first aspect, the present invention relates to a coating apparatus for applying a coating on glass containers with a chemical compound comprising:
 a housing (2) with a coating tunnel
 a conveyer belt (3) moving the containers (20) through the coating tunnel from the inlet (5) to the outlet (6) of the said coating tunnel at least one circuit (7) for circulation of a coating compound and at least two air curtains (25a) and (25b) a first at the inlet (5) and a second at the outlet (6).

In a second aspect the present invention relates to a process of applying a coating on the surface of glass containers comprising the steps of:

conveying the glass containers (20) on a conveyer belt (3) through a coating tunnel inside a housing (1) from the inlet (5) to the outlet (6), circulating a coating compound through the coating tunnel with a circuit (7)

using least two air curtains (25a) and (25b) a first at the inlet (5) and a second the outlet (6).

In a third aspect, the present invention relates to the use of at least two air curtains (25a) and (25b) a first at the inlet (5) and a second outlet (6) in a coating apparatus for applying a coating on glass containers with a chemical compound comprising:

a housing (2) with a coating tunnel a conveyer belt (3) moving the containers (20) through the coating tunnel from the inlet (5) to the outlet (6) of the said coating tunnel at least one circuit (7) for circulation of a coating compound.

According to another aspect the present invention relates to a glass container on which a coating has been applied on its surface by a process comprising the steps of:

conveying the glass container (20) through a coating tunnel from the inlet (5) to the outlet (6), circulating a coating compound through the coating tunnel with a circuit (7) comprising (25)

using at least two air curtains (25a) and (25b) a first at the inlet (5) and a second the outlet (6).

According to an additional aspect the present invention relates to the use of a coating apparatus for applying a coating on the surface of a glass container, said coating apparatus is comprising:

a housing (2) with a coating tunnel a conveyer belt (3) moving the containers (20) through the coating tunnel from the inlet (5) to the outlet (6) of the said coating tunnel at least one circuit (7) for circulation of a coating compound and at least two air curtains (25a) and (25b) a first at the inlet (5) and a second the outlet (6).

Additionally the coating apparatus for applying a coating on glass containers with a chemical compound comprises blowing means (12), slots (30) in the inner side wall (80).

A circuit (7) for circulation the coating compound is also called loop. The coating apparatus can also comprise several circuits or loops. It comprises at least one circuit or primary loop, where the coating compound or coating generation compound is added. This place where the coating compound or coating generation compound is added is called feed point.

According to a variation of the present invention the coating apparatus can also comprise one or more recirculating loops (8). The recirculating loop or loops (8) is or are after the primary loop (7a) and before the carrier gas flow that is separated, in the sense of the direction of the passing containers on the conveyer belt. Such a recirculating loop (8) is not shown in FIGS. 2 and 3, but is well known from prior art as presented in FIG. 1.

By the generic term "air" as used is denoted the carrier gas that is used for the coating compound. It is obvious that any inert gas or a gas that is inert to the coating compound, the container and the interior of the coating hood, such as nitrogen could be used. Because of its convenience and low cost however the preferred gas is air.

By the term "coating compound" as used in the present invention is denoted a chemical compound that is introduced in the coating apparatus. The coating compound is used directly to coat a surface or it is transformed during the coating application in another compound that forms the coating. In the latter case it could also be called coating generating compound.

By the term "exhaust" as used is denoted the carrier gas that is still loaded with a minor quantity of the coating compound not applied to the glass container that escapes at the entry and especially the outlet of the coating tunnel, where the containers enter and sort.

By the term "loop" as used in the present invention is denoted a circuit for the carrier gas or air loaded with the coating compound that enters and leaves the coating tunnel. Such a loop comprises at least one jet slot and at least one receiving slot that are located on the opposite inner side walls of the hood. The loop could comprises also conduits in form of tubes and pipes. These conduits in form of tubes and pipes are necessary to transport the carrier gas from the receiving slot to the jet slot By the term "primary loop" as used in the present invention is denoted a circuit that comprises at least a feed point of the coating compound and circulates the carrier gas loaded with the coating compound or air loaded with the coating compound. The loop or circuit enters and leaves twice the coating tunnel by respective jet slots and receiving slots. In other words the loop or circuit makes a complete 360° turn.

By the term "recirculating loop" as used in the present invention is denoted a circuit that does not comprise any feed point and that recirculates the carrier gas loaded with the coating compound or air loaded with the coating compound coming from the primary loop.

By the term "circuit" as used in the present invention is denoted a pathway for the circular flow of the carrier gas or air comprising the coating compound or coating generating compound through the respective parts of the coating apparatus.

By the term "air curtain" as used in the present invention is meant an air flow lateral to the movement of the conveyer belt and the mechanical parts or means for establishing the air flow. The air curtain or the air of the air curtain preferably does not comprise coating compound at least not voluntary. However it is possible that some traces of coating compound could be present due to contamination.

With regard to a coating apparatus from the prior art, an embodiment of said coating apparatus is shown in FIG. 1a. The coating apparatus (1) comprises a housing (2) with coating tunnel, a conveyer belt (3) moving the containers (20) through the coating tunnel from the inlet (5) to the outlet (6) of the said coating tunnel, one circuit being the primary loop (7) with at least one feed point (4) for the coating compound, one or more circuits being recirculating loops (8), blowing means (12) and exhaust means (11) in proximity of the inlet (5) end outlet (6). Details of such a coating apparatus and its components can be found in document U.S. Pat. No. 4,668,268 or 4,389,234.

Still with regard to a coating apparatus from the prior art, another embodiment of such a coating apparatus (1) is shown in FIG. 1b. Said coating apparatus comprises a housing (2) with coating tunnel, a conveyer belt (3) moving the containers (20) through the coating tunnel from the inlet (5) to the outlet (6) of the said coating tunnel, one primary loop (7) with at least one feed point (4) for the coating compound, blowing means (12), optionally one or more recirculating loops (8) and a half open loop (9) going from the outlet (6) to the inlet (5) of the coating tunnel. Details of such a coating apparatus and its components can be found in document WO2014/177651. The function of the half open loop (9) is to recover coating compounds at the end of the hood, close to the outlet (6) and reintroduce into the coating process by transferring it to the inlet.

Still with regard to a coating apparatus from the prior art, another embodiment of such a coating apparatus (1) is shown in FIG. 2. Said coating apparatus comprises a housing (2) with coating tunnel, a conveyer belt (3) moving the containers (20) through the coating tunnel from the inlet (5) to the outlet (6) of the said coating tunnel, blowing means (12) comprising a blower wheel (12a) and a motor (12a) for turning the blower wheel, for circulating the coating compound through the circuits or respective loops of the coating tunnel and inner side wall (80) with slots (30). Details of such a coating apparatus and its components can be found in document U.S. Pat. No. 5,140,940.

With regard to the coating apparatus of the present invention, it is shown schematically in FIG. 3, said coating apparatus (1) comprises a housing (2) with coating tunnel, a conveyer belt (3) moving the containers (20) through the coating tunnel from the inlet (5) to the outlet (6) of the said coating tunnel, one primary loop (7) with a least one feed point (4) for the coating compound, blowing means (12), and least two air curtains (25a) (25b) a first at the inlet (5) and a second at the outlet (6).

Optionally the coating apparatus of the present invention can comprise one or more recirculating loops.

In a one embodiment the coating hood according to the invention comprises additionally one or more recirculating loops.

The position of the recirculating loop or recirculating loops can be behind the primary loop (in view of the movement of the conveyer belt) or around the primary loop, latter possibility as shown in FIGS. 1 and 2 of the coating apparatus from the prior art.

Additionally the coating apparatus comprises at least one jet slot (30a) and receiver slot (30b) in the inner side wall (80), which are not shown in the FIG. 1. The slots (30) are respectively the entry or exit of the circuit (7) or each respective loop towards or from the central chamber of the coating tunnel, where the conveyer belt (3) with the containers (20) passes. By the jet slot (30a) the coating compound or carrier gas enters this chamber. By the receiver slot (30b) the coating compound or carrier gas leaves this chamber.

Preferably each circuit or loop of the coating apparatus (1) comprises at least one jet slot (30a) and receiver slot (30b).

Additionally the coating apparatus comprises blowing means or blowers (12). These blowers (12) keep the carrier gas with the coating compound circulating inside the hood and make it passing through the respective loops. The blower can either push the carrier gas with coating compound forward inside the centre section of the tunnel where the conveyer belt with the container passes or suck it outside. The blowing means (12) comprises a blower wheel (12b) and a motor (12a) for rotating the blower wheel. Depending on the sense of the rotation of the blower wheel and its blades, the carrier gas with the coating compound is either pushed or sucked.

The coating apparatus of the present invention comprises at least two air curtains (25a) and (25b) a first (25a) at the inlet (5) and a second (25b) at the outlet (6). The air curtains consist of a lateral air flow relative to the movement of the conveyer belt. Lateral does not mean that is has to be an angle of exactly 90°.

The at least two air curtains (25a) and (25b) a first (25a) at the inlet (5) and a second (25b) at the outlet (6) reduces the exchange between the atmosphere or air outside the coating apparatus and inside the coating apparatus. The two air curtains are a kind of ports or gates that allows to keep a lower pressure inside the coating apparatus in comparison to the outside. By inside the coating apparatus is meant the circuit where the coating compound circulates, preferably close to the primary loop (7).

Preferably the pressure inside the coating apparatus is at least 1 mbar less than on the outside of the coating apparatus. More preferably the pressure inside the coating apparatus is at least 2 mbar, still more preferably at least 3 mbar and most preferably 5 mbar less than on the outside of the coating apparatus.

Preferably the pressure inside the coating apparatus is at most 100 mbar less than on the outside of the coating apparatus. More preferably the pressure inside the coating apparatus is at at most 99 mbar, still more preferably at most 98 mbar and most preferably at most 95 mbar less than on the outside of the coating apparatus.

Advantageously the pressure difference between the inside of the coating apparatus and the outside is between 1 mmbar and 100 mbar. More advantageously the pressure difference between the inside of the coating apparatus and the outside is between 2 mmbar and 99 mbar, still more advantageously between 3 mmbar and 98 mbar and most advantageously between 5 mmbar and 95 mbar.

It is obvious that the pressure p of gasses is a function of the temperature T, but the relation between the two of them is well known by the respective physical gas laws.

With regard to the air curtains (25a) and (25b), a first (25a) at the inlet (5) and a second (25b) at the outlet (6), by this is meant that they are situated respectively between the loop or circuit or loops or circuits and other means that circulate the coating compound through the coating tunnel and the inlet (5) or outlet (6) of the coating apparatus (1).

The air curtain (25a) is close to the inlet (5) and is kind of the entry into the inner chamber of coating apparatus.

The air curtain (25b) is close to the outlet (6) the exit out of the inner chamber of coating apparatus.

By inner chamber of the coating apparatus is meant the part where the coating compound is circulated. This inner chamber is situated between the two air curtains (25a) and (25b).

The air curtain (25a) (25b) comprises or consists of a blower (50) which makes a constant airflow (100) through at least one jet slot (40). The added air of airflow (100) will be sucked off with an exhaust blower (55) in order to not add air into the hood or coating tunnel, where the coating compound is circulated.

The air flow of the air curtains (25a) and (25b) is not connected with the inner chamber where the coating compound is circulated.

By constant air flow is meant that the air flow is within a given interval of either speed (m/s) of passing air or a global voluminous flow ($m^3/s$) of air or a voluminous flow over a surface (($m^3/s$)/$m^2$).

In one embodiment the air curtains (25a) and (25b) can be part of the housing (2) of the coating apparatus (1).

Preferably the distance $d_3$ between the air curtain (25a) and the inlet (5) is less than 300 mm. The distance $d_3$ is measured between the inlet (5) which is defined by the housing (2) of coating apparatus (1) on both sides of the conveyer belt (3) and the limit of air curtain towards the inlet (5).

Preferably the distance $d_1$ between the air curtain (25b) and the outlet (6) is less than 300 mm. The distance $d_1$ is measured between the outlet (6) which is defined by the housing (2) of coating apparatus (1) on both sides of the conveyer belt (3) and the limit of air curtain towards the outlet (6).

In another embodiment, it would also be possible to add the air curtains (25a) and (25b) to an existing coating apparatus not having them yet, as additional modules.

The air curtains can have different directions of the air flow (100) relatively to the conveyer belt (3). Examples are given in FIG. 5 where the air curtains (25a) (25b) have various directions of the air flow (100) relatively to the conveyer belt. Other directions in between the shows are easily imaginable. The air flow (100) of the air curtain is always in the y/z plane and perpendicular to the x-direction.

In a first preferred embodiment the direction of the air flow of air curtains is horizontal which means parallel in to the z-direction in the y/z plane and perpendicular to the x-direction.

The air curtains (25a) or (25b) can comprise also two or more air curtains itself, which are called sub air curtains. Examples are shown in FIG. 6 where one air curtain (25a) or (25b) is divided in two sub air curtains (25a') and (25a") or (25b') and (25b"). These two sub air curtains (25a') and (25a") or (25b') and (25b") can have an air flow in the same direction or in different directions.

In one embodiment the air curtains (25a) or (25b) comprise also two or more air curtains itself, which are called sub air curtains. Examples are shown in FIG. 6 where one air curtain (25a) or (25b) is divided in two sub air curtains (25a') and (25a") or (25b') and (25b"). These two sub air curtains (25a') and (25a") or (25b') and (25b") have an air flow in the same direction or in different directions.

The distance $d_2$ in x-direction between the two sub air curtains (25a') and (25a") or (25b') and (25b") is at least 1 mm. Preferably the distance d in x-direction between the two sub air curtains (25a') and (25a") or (25b') and (25b") is at least 5 mm, more preferably 10 mm, even more preferably 20 mm, most preferably 25 mm, advantageously 50 mm, more advantageously 75 mm and most advantageously 100 mm.

The distance $d_2$ in x-direction between the two sub air curtains (25a') and (25a") or (25b') and (25b") is at most 400 mm. Preferably the distance d in x-direction between the two sub air curtains (25a') and (25a") or (25b') and (25b") is at most 350 mm, more preferably 300 mm, even more preferably 250 mm, most preferably 200 mm, advantageously 175 mm, more advantageously 150 mm and most advantageously 125 mm.

The distance $d_2$ in x-direction between the two sub air curtains (25a') and (25a") or (25b') and (25b") is between 1 mm and 400 mm, preferably between 5 mm and 350 mm and more preferably between 10 mm and 300 mm.

Preferably the circuit (7) or loop of the coating apparatus (1) according to the invention, comprises at least one blowing means (12) for the coating compound. More preferably the coating apparatus of the present invention comprises at least two blowing means (12), the blowing means are on opposite sides of the coating apparatus, as shown in FIG. 3.

The blowing means (12) comprise a blower wheel (12b).

Preferably the two on opposite sides situated blower wheels (12b) of the at least two blowing means circulate in different meaning opposite directions. When looking from one side at the coating apparatus, one blower wheel rotates clockwise, while the other blower wheel on the other side rotates counter clockwise.

Preferably the blower wheel or blower wheels rotate between 100 rpm and 10 000 rpm, more preferably between 200 rpm and 9 000 rpm.

Optionally the coating apparatus according to the invention can comprise means for exhaust. This can be either at the inlet or at the outlet or at the inlet and the outlet additional exhaust means are present.

The coating compound is introduced through at least one feed point (4) in to the coating apparatus. This can be an internal feed point as in FIG. 1 or 3 or an external feed point.

In one embodiment the feed point (4) is based at the primary loop (7) as an internal feed point as shown in FIG. 3. The coating compound is introduced by the means of pipes, latter are not shown in the figure.

In another embodiment the coating compound is introduced by hot recirculating air as a side stream to dose the coating compound in, which is an external feed.

The hollow glass containers are transported in a single or double line by a conveyer through a tunnel formed in the coating hood under the housing. The conveyer carries the bottles in the direction designated by the arrow, in FIGS. 1, 2 and 3 from left to right.

With regard to the coating compound introduced in the coating apparatus at one or more feedings points, it can be chosen from organometallic compounds, metal halides or other suitable compounds as coating compound precursor.

Preferably the coating compound is an organic tin halogenide, advantageously it is monobutyl tin trichloride.

With regard to the coating formed at the surface of the containers and applied in the hood it is a metal oxide as $SnO_2$, $TiO_2$, $Al_2O_3$ or $ZnO$. The metal oxide is derived from the decomposition inorganic or organometallic compounds. Latter are the before mentioned coating generating compounds.

In a first preferred embodiment the coating is tin oxide. The tin oxide is derived from the decomposition inorganic or organic tin compound advantageously of an organic tin halogenide, more advantageously from monobutyl tin trichloride.

With regard to the process of applying a coating on the surface of glass containers, it comprises the steps of:
  conveying the glass containers (20) on a conveyer belt (3) through a coating tunnel inside a housing (1) from the inlet (5) to the outlet (6),
  circulating a coating compound through the coating tunnel with a circuit (7)
  using at least two air curtains (25a) and (25b) a first at the inlet (5) and a second the outlet (6).

The process comprises preferably additionally the step of:
  using blowing means (12), said blowing means are on opposite sides of the coating apparatus said blowing means (12) comprise a blower wheel (12b) which circulate in different directions.

The process comprises comprising additionally the step of:
  keeping a lower pressure inside the coating apparatus in comparison to the outside.

The respective elements of the coating hood (1) in the process are the same as describe before.

The circulation step of said process, circulates the coating compound or coating generating compounds that is introduced by a feed point (4) with the carrier gas by the help of blowing means (12). The circuit of the circulation step comprises the passage of the side wall (80) via the slots (30)

inside the side wall. For entering the inner part of the coating tunnel where the container (20) are on the conveyer belt, the circuit leaves the compartment (70), via the jet slots (30a). On the opposite side the circuit leaves the inner part of the coating tunnel where the container (20) are on the conveyer belt, via receiver slots (30b) and enter the opposite compartment comprising (70). To return to the initial departing point the circuit continues in the same manner as described.

The using step of the air curtains of said process allows to reduce the loss of coating compound.

With regard to the glass container on which a coating has been applied on its surface by a process comprising the steps of:
- conveying the glass containers (20) on a conveyer belt (3) through a coating tunnel inside a housing (1) from the inlet (5) to the outlet (6),
- circulating a coating compound through the coating tunnel with a circuit (7)
- using at least two air curtains (25a) and (25b) a first at the inlet (5) and a second the outlet (6).

Preferably the glass container on which a coating has been applied on its surface by a process that comprises additionally a step of blowing the gas comprising the coating generating compound with one or more recirculating loops (8) through the coating tunnel, after the circuit of primary loop (7).

With regard to the glass container on which a coating has been applied on its surface by a coating apparatus comprising:
- a housing (2) with a coating tunnel
- a conveyer belt (3) moving the containers (20) through the coating tunnel from the inlet (5) to the outlet (6) of the said coating tunnel
- at least one circuit (7) for circulation of a coating compound and
- at least two air curtains (25a) and (25b) a first at the inlet (5) and a second the outlet (6).

The coating apparatus according to the invention is used to apply a coating on the surface of a glass containers.

The present invention concerns as well an improved method for applying a hot end coating integrated in the glass container manufacturing process.

FIGURES

FIG. 1a: schematic representation of one existing hood from the state of the art with a recirculating loop.

Coating compound is introduced into the coating apparatus (1) or hood at a feed point (4). The hood (1) comprises a housing (2) and a conveyer belt (3) running there through. Containers (4) are transported on the belt that moves them from the entrance or inlet (5) to the exit outlet (6) of the hood (1).

The containers (20) are only presented diagrammatically by circles.

The hood also comprises one primary loop (7) with a least one feed point (4) for the coating compound, one or more recirculating loops (8) and exhaust means (11) in proximity of the inlet (5) end outlet (6).

FIG. 1b: schematic representation of one existing hood with an additional half loop (9).

Coating compound is introduced into the coating apparatus (1) or hood at a feed point (4). The hood (1) comprises a housing (2) and a conveyer belt (3) running there through. Containers (4) are transported on the belt, that moves them from the entrance or inlet (5) to the exit outlet (6) of the hood (1).

The containers (20) are only presented diagrammatically by circles.

The hood also comprises one primary loop (7) with a least one feed point (4) for the coating compound, one or more recirculating loops (8) and a half open loop (9) going from the outlet (6) to the inlet (5) of the coating tunnel.

FIG. 2: schematic representation of another existing hood from the state of the art where the inner side wall (80) with the slots (30) is more detailed. The hood (1) comprises a housing (2) and a conveyer belt (3) running there through. Containers (4) are transported on the belt that moves them from the entrance or inlet (5) to the exit outlet (6) of the hood (1). Behind the inner side wall (80) with the slots (30) blowing means (12) are shown, comprising a blower wheel (12b) and a motor (12a).

FIG. 3: schematic representation of the hood according to one embodiment of the present invention with two air curtains (25a) (25b) a first at the inlet (5) and a second at the outlet (6). The air curtain is represented by the grey rectangle and embodiments are more detailed in FIG. 4, FIG. 7 and FIG. 8. The inner side wall (80) of the hood comprises the slots (30). The hood (1) comprises a housing (2) and a conveyer belt (3) running there through. Containers (4) are transported on the belt that moves them from the entrance or inlet (5) to the exit outlet (6) of the hood (1). Behind the inner side wall (80) with the slots (30) blowing means (12) are shown, comprising a blower wheel (12b) and a motor (12a). The coating generating compound is introduced by a feed point (4) with the carrier gas by the help of blowing means (12). The circuit comprises the passage of the side wall (80) via the slots (30) inside the side wall. For entering the inner part of the coating tunnel where the container (20) are on the conveyer belt, the circuit leaves the compartment (70) via the jet slots (30a). On the opposite side the circuit leaves the inner part of the coating tunnel where the container (20) are on the conveyer belt, via receiver slots (30b) and enter the opposite compartment (70). The blowing means on this side will continue to circulate the left over coating generating compound in the same manner as explained before and a part of the coating generating compound returns to the initial departing point and the circuit begins again.

FIG. 4: schematic representation of one embodiment of the air curtain (25a) or (25b) in the z/x plane. As an example an air curtain (25b) at the outlet (6) is given. The grey rectangle details the elements not shown in FIG. 3. In the right part of FIG. 4 the grey rectangle is given to better show the mechanical parts of the air curtain (25b). The air curtain (25b) comprises the lateral air flow (100) perpendicular towards the conveyer belt (3), one blower (50), one jet slot (40), an exhaust blower (55). The distance $d_1$ between the air curtain and the outlet (6) is shown. The air curtain (25a) at the inlet (5) is not shown, but is identical the other way round.

FIG. 5: front view in the y/z plane of the air curtains (25a) or (25b), where the air flow (100) direction is indicated by flashes. More directions are imaginable than shown in the figures.

FIG. 6: combinations of two air curtains called sub air curtains (25a') or (25b') and (25a") or (25b") for air curtains (25a) or (25b) in dimensional view, with a distance $d_2$ between the two sub air curtains (25a') or (25b') and (25a") or (25b"). All shown and not shown combinations of FIG. 5 are imaginable.

FIG. 7: schematic representation of one embodiment of the air curtain (25b) with two sub air curtains (25b') and (25b"). The air flow of the two sub air curtains (25b') and (25b") is in different directions. The air curtain (25b) comprises the lateral air flow (100) perpendicular towards the conveyer belt (3), two blowers (50), two jet slots (40) and two exhaust blower (55). The distance $d_1$ between the air curtain and the outlet (6) is shown. The distance $d_2$ between the two sub air curtains (25b') and (25b") is shown.

FIG. 8: schematic representation of one embodiment of the air curtain (25b) with two sub air curtains (25b') and (25b"). The air flow of the two sub air curtains (25b') and (25b") is in the same direction. The air curtain (25b) comprises two lateral air flows (100) perpendicular towards the conveyer belt (3), one blower (50), one jet slot (40) and one exhaust blower (55).

The invention claimed is:

1. A coating apparatus for applying a coating on glass containers with a chemical compound, the coating apparatus comprising:
   a housing with a coating tunnel;
   a conveyer belt moving the glass containers through the coating tunnel from an inlet to an outlet of the coating tunnel;
   at least one circuit for circulation of a coating compound; and
   at least two air curtains, a first air curtain at the inlet and a second air curtain at the outlet, wherein the first air curtain and the second air curtain are not a part of the at least one circuit for circulation of a coating compound or any other mechanism for circulation of a coating compound.

2. The coating apparatus according to claim 1, wherein said at least two air curtains comprise a lateral airflow relative to movement of the conveyer belt.

3. The coating apparatus according to claim 1, wherein said at least two air curtains are situated respectively between the at least one circuit and other mechanisms that circulate the coating compound through the coating tunnel and the inlet or outlet of the coating apparatus.

4. The coating apparatus according to claim 1, wherein each of the at least two air curtains comprises at least a blower which makes a constant airflow through at least one jet slot.

5. The coating apparatus according to claim 1, further comprising an exhaust blower for sucking off air in order to not add air into a hood or the coating tunnel.

6. The coating apparatus according to claim 1, wherein the direction of the air flow of the at least two air curtains is horizontal relative to the movement of the conveyer belt.

7. The coating apparatus according to claim 1, wherein at least one of the at least two air curtains comprises two or more air curtains itself, which are called sub air curtains.

8. The coating apparatus according to claim 7, wherein the two sub air curtains have an air flow in the same direction or in different directions.

9. The coating apparatus according to claim 7, wherein a distance $d_2$ in x-direction between the two sub air curtains is between 1 mm and 400 mm.

10. The coating apparatus according to claim 1, wherein the first air curtain at the inlet and the second air curtain at the outlet are situated respectively between the circuit and other means that circulate the coating compound through the coating tunnel and the inlet or outlet of the coating apparatus.

11. The coating apparatus according to claim 1, wherein a distance $d_3$ between the first air curtain and the inlet is less than 300 mm.

12. The coating apparatus according to claim 1, further comprising at least one of the following:
    a blowing mechanism,
    at least one feed point, and
    slots in an inner side wall.

13. The coating apparatus according to claim 1, wherein the coating apparatus comprises at least two blowing mechanisms, said at least two blowing mechanisms being on opposite sides of the coating apparatus.

14. The coating apparatus according to claim 13, wherein the at least two blowing mechanisms comprise at least two blower wheels.

15. The coating apparatus according to claim 14, wherein the at least two blower wheels situated on opposite sides circulate in different directions.

16. The coating apparatus according to claim 1, wherein a pressure inside the coating apparatus is at least 1 mbar less than a pressure on the outside of the coating apparatus.

17. The coating apparatus according to claim 1, wherein a pressure inside the coating apparatus is at most 100 mbar less than a pressure on the outside of the coating apparatus.

18. The coating apparatus according to claim 1, wherein a pressure difference between the inside of the coating apparatus and the outside is between 1 mmbar and 100 mbar.

* * * * *